United States Patent
Kummer et al.

(10) Patent No.: US 7,115,217 B2
(45) Date of Patent: *Oct. 3, 2006

(54) PHOSPHOR FOR LIGHT SOURCES AND ASSOCIATED LIGHT SOURCE

(75) Inventors: Franz Kummer, Munich (DE); Franz Zwaschka, Ismaning (DE); Andries Ellens, Munich (DE); Alexandra Debray, Neumarkt (DE); Guenther Waitl, Regensburg (DE)

(73) Assignees: Patent - Treuhand - Gesellschaft fuer Elektrische Gluehlampen mbH, Munich (DE); OSRAM Opto Semiconductors GmbH & Co OHG, Regensburg (DE)

( * ) Notice: Subject to any disclaimer, the term of this patent is extended or adjusted under 35 U.S.C. 154(b) by 196 days.

This patent is subject to a terminal disclaimer.

(21) Appl. No.: 10/687,436

(22) Filed: Oct. 16, 2003

(65) Prior Publication Data

US 2004/0079956 A1    Apr. 29, 2004

Related U.S. Application Data

(63) Continuation of application No. 09/787,208, filed as application No. PCT/DE00/02241 on Jul. 8, 2000, now Pat. No. 6,669,866.

(30) Foreign Application Priority Data

Jul. 23, 1999   (DE) ................... 199 34 126
Oct. 27, 1999   (DE) ................... 199 51 790
Dec. 30, 1999   (DE) ................... 199 63 791

(51) Int. Cl.
   *H05B 33/14*   (2006.01)
   *C09K 11/80*   (2006.01)

(52) U.S. Cl. ............... 252/301.36; 252/301.4 R; 313/501; 257/98; 257/100; 257/E33.05; 257/E33.06

(58) Field of Classification Search ......... 252/301.4 R, 252/301.36; 257/98, 100, E33.059, E33.061
See application file for complete search history.

(56) References Cited

U.S. PATENT DOCUMENTS

| | | | |
|---|---|---|---|
| 6,066,861 A * | 5/2000 | Hohn et al. ............... 257/99 |
| 6,504,179 B1 * | 1/2003 | Ellens et al. ............... 257/88 |
| 6,576,930 B1 | 6/2003 | Reeh et al. ............... 257/98 |
| 6,596,195 B1 * | 7/2003 | Srivastava et al. .... 252/301.4 R |
| 6,630,077 B1 * | 10/2003 | Shiang et al. ......... 252/301.4 R |
| 6,669,866 B1 * | 12/2003 | Kummer et al. ...... 252/301.4 R |

FOREIGN PATENT DOCUMENTS

| | | |
|---|---|---|
| EP | 0 142 931 | 5/1985 |
| EP | 0 124 175 B1 | 7/1986 |

(Continued)

OTHER PUBLICATIONS

Abstract, CN1254747 (May 31, 2000).

Primary Examiner—C. Melissa Koslow
(74) Attorney, Agent, or Firm—Robert F. Clark

(57) ABSTRACT

A phosphor for light sources, the emission from which lies in the short-wave optical spectral region, as a garnet structure $A_3B_5O_{12}$. It is activated with Ce, the second component B representing at least one of the elements Al and Ga, and the first component A is terbium or terbium together with at least one of the elements Y, Gd, La and/or Lu.

In a preferred embodiment, a phosphor having a garnet of structure $(Tb_{1-x-y}RE_xCE_y)_3(Al,Ga)_5O_{12}$,
where
RE=Y, Gd, La and/or Lu;
$0 \leq x \leq 0.5-y$;
$0 < y < 0.1$ is used.

41 Claims, 7 Drawing Sheets

Emission spectrum of the phosphor in accordance with Exemplary embodiment 1 when excited at 430 nm

FOREIGN PATENT DOCUMENTS

| | | |
|---|---|---|
| EP | 0 208 713 B1 | 3/1990 |
| EP | 0 228 010 | 8/1991 |
| EP | 0 936 682 B1 | 8/2000 |
| GB | 2000173 | 1/1979 |
| GB | 1600492 | 10/1981 |
| JP | 49-3629 | 1/1974 |
| JP | 49-3631 | 1/1974 |
| JP | 10-247750 | 9/1998 |
| WO | WO 97/50132 | 12/1997 |
| WO | WO 98/05078 | 5/1998 |

* cited by examiner

PHOSPHOR FOR LIGHT SOURCES AND ASSOCIATED LIGHT SOURCE

CROSS REFERENCES TO RELATED APPLICATIONS

This application is a continuation of application Ser. No. 09/787,208, filed Mar. 15, 2001 now U.S. Pat. No. 6,669,866.

TECHNICAL FIELD

The invention relates in particular to a yellow-emitting garnet phosphor for excitation by a light source with short wavelengths in the visible blue spectral region, with the result that white light is generated. A lamp (primarily a fluorescent lamp) or an LED (light-emitting diode) is particularly suitable as the light source.

PRIOR ART

WO 98/05078 has already disclosed a phosphor for light sources and an associated light source. In that document, the phosphor used is a garnet of the structure $A_3B_5O_{12}$, the host lattice of which, as first component A, comprises at least one of the rare earths Y, Lu, Sc, La, Gd or Sm. Furthermore, one of the elements Al, Ga or In is used for the second component B. The only dopant used is Ce.

A very similar phosphor is known from WO 97/50132. The dopant used in that document is either Ce or Tb. While Ce emits in the yellow spectral region, the emission from Tb is in the green spectral region. In both cases, the complementary color principle (blue-emitting light source and yellow-emitting phosphor) is used to achieve a white luminous color.

Finally, EP-A 124 175 describes a fluorescent lamp which, in addition to a mercury fill, contains a plurality of phosphors. These are excited by UV radiation (254 nm) or also by short-wave radiation at 460 nm. Three phosphors are selected in such a way that they add up to form white (color mixture).

SUMMARY OF THE INVENTION

According to the invention, for light sources from which the emission lies in the short-wave optical spectral region, a phosphor which has a garnet structure $A_3B_5O_{12}$ and which is doped with Ce is used, the second component B representing at least one of the elements Al and Ga and the first component A containing terbium. The process for producing the phosphor is characterized by the following process steps: (a) comminution of the oxides and addition of a flux; (b) first firing in forming gas; (c) milling and screening; and (d) second firing. Surprisingly, it has been found that under particular circumstances, namely under blue excitation in the range from 420 to 490 nm, terbium (Tb) is suitable as a constituent of the host lattice (first component of the garnet) for a yellow-emitting phosphor, the activator of which is cerium. Previously, in this context Tb has only been considered as an activator or coactivator, together with cerium, for emission in the green region, if excitation is produced by cathode rays (electrons) or short-wave UV photons (GB-A 1 600 492 and EP-A 208 713).

In this case, terbium, as the principal constituent of the first component A of the garnet, can be used on its own or together with at least one of the rare earths Y, Gd, La and/or Lu.

At least one of the elements Al or Ga is used as the second component. The second component B may additionally contain In. The activator is cerium. In a particularly preferred embodiment, a garnet of the structure
$(Tb_{1-x-y}RE_xCe_y)_3(Al\ Ga)_5O_{12}$, where
RE=Y, Gd, La and/or Lu;
$0 \leq x \leq 0.5-y$;
$0 < y < 0.1$ is used.

The phosphor absorbs in the range from 420 to 490 nm and can thus be excited by the radiation from a blue light source, which is in particular the radiation source for a lamp or LED. Good results have been achieved with a blue LED whose emission peak was at 430 to 470 nm. The emission peak of the Tb-garnet: Ce phosphor is at approximately 550 nm.

This phosphor is particularly useful for use in a white LED based on the combination of a blue LED with the Tb-garnet phosphor, which is excited by absorption of part of the emission from the blue LED and the emission from which supplements a remaining radiation from the LED, to form white light.

A Ga(In)N-LED is particularly suitable as the blue LED, but any other route for producing a blue LED which emits in the range from 420 to 490 nm is also suitable. 430 to 470 nm is particularly recommended as the principal emission region, since this is where efficiency is highest.

By selecting the type and quantity of rare earths, it is possible to fine-tune the location of the absorption and emission bands, in a similar way to that which is known from the literature for other phosphors of type YAG:Ce. In conjunction with light-emitting diodes, it is particularly suitable for x to be $0.25 \leq x \leq 0.5-y$.

The particularly preferred range for y is $0.02 < y < 0.06$.

The phosphor according to the invention is also suitable for combination with other phosphors.

A garnet of structure
$(Tb_xRE_{1-x-y}Ce_y)_3(Al,Ga)_5O_{12}$,
where RE=Y, Gd, La and/or Lu;
$0 \leq x \leq 0.02$, in particular x=0.01;
$0 < y < 0.1$ has proven particularly suitable as the phosphor. Y frequently lies in the range from 0.01 to 0.05.

Generally, relatively small amounts of Tb in the host lattice serve primarily to improve the properties of known cerium-activated phosphors, while the addition of relatively large amounts of Tb can be used in a controlled way in particular to shift the wavelength of the emission from known cerium-activated phosphors. Therefore, a high proportion of Tb is particularly suitable for white LEDs with a low color temperature of below 5000 K.

In one embodiment, the process for producing a phosphor having a garnet structure as represented by $A_3B_5O_{12}$:Ce, wherein A is terbium or terbium together with at least one of the elements Y, Gd, La. and/or Lu and B is at least one of the elements Al and Ga, comprises: (a) intimately mixing cerium oxide, oxides of A and B, and at least one flux to form a mixture; and (b) firing the mixture in forming gas to form the phosphor. More particularly, the flux is $BaF_2$, $HBO_3$, or both.

In another embodiment of the process, a stoichiometric excess of an oxide of B is used to form the mixture. More particularly, a stoichiometric excess of aluminum oxide is used to form the mixture.

In a further embodiment of the process, the mixture is fired at a temperature from 1450° C. to 1550° C. and for 3 hours to 6 hours. More particularly, the firings are each for three hours.

BRIEF DESCRIPTION OF THE DRAWINGS

The invention is to be explained in more detail below with reference to a number of exemplary embodiments. In the drawing.

DETAILED DESCRIPTION OF THE INVENTION

Figure 1:
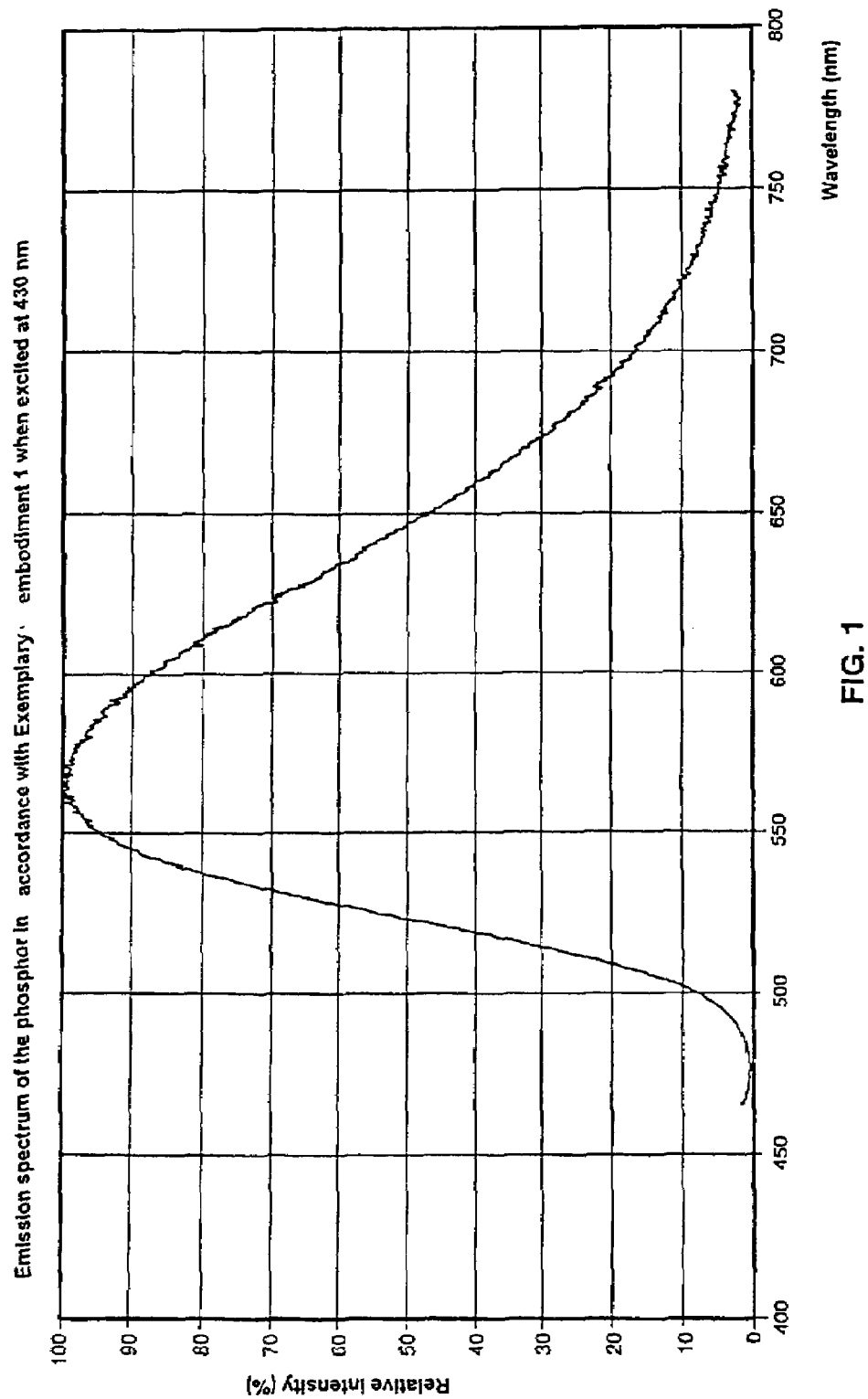
FIG. 1 shows an emission spectrum of a first Tb-garnet phosphor.
Figure 2:
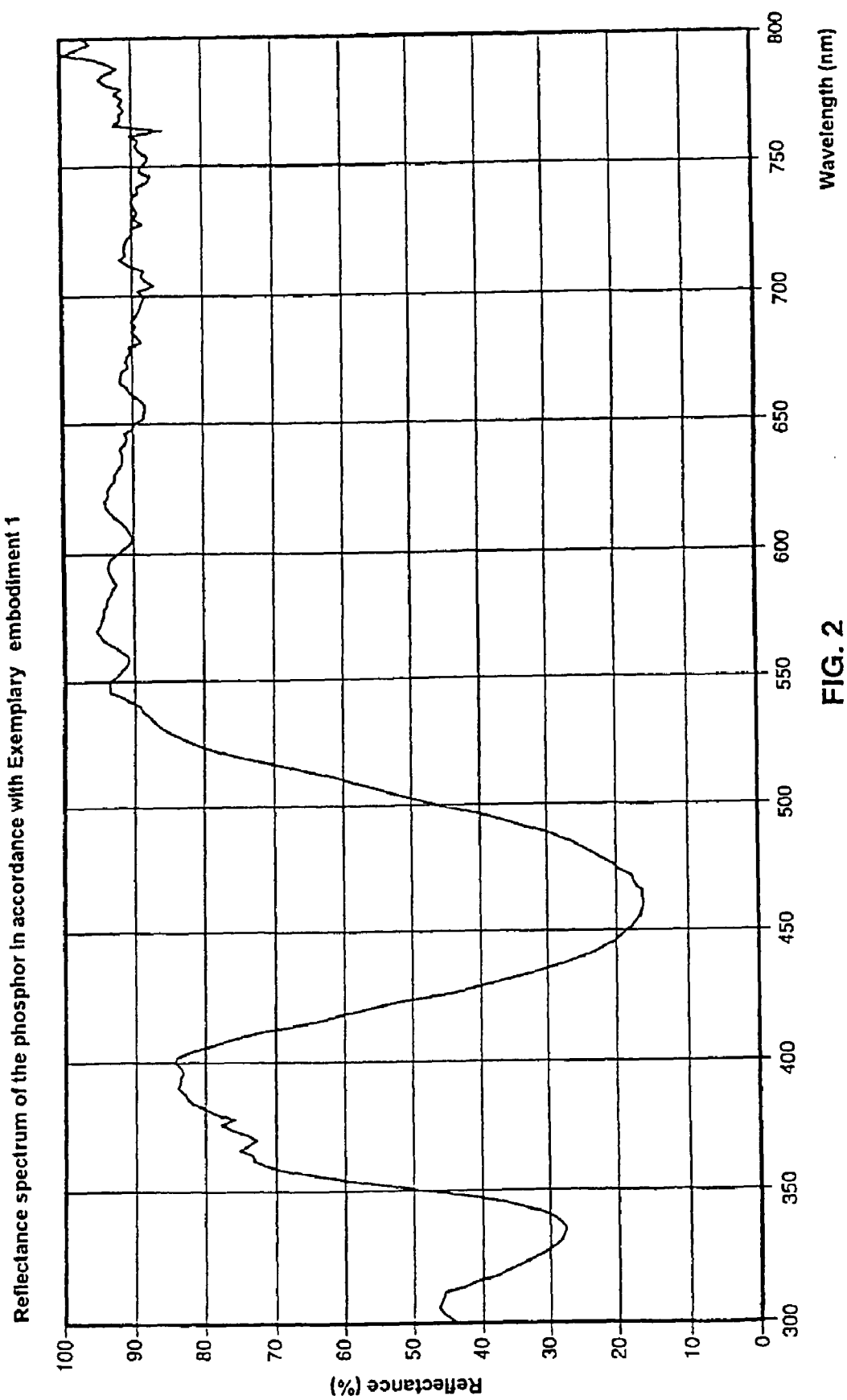
FIG. 2 shows the reflectance spectrum of this Tb-garnet phosphor.

Exemplary Embodiment No. 1:

| The components | |
|---|---|
| 9.82 g | Yttrium oxide $Y_2O_3$ |
| 2.07 g | Cerium oxide $CeO_2$ |
| 37.57 g | Terbium oxide $Tb_4O_7$ |
| 26.41 g | Aluminum oxide $Al_2O_3$ |
| 0.15 g | Barium fluoride $BaF_2$ |
| 0.077 g | Boric acid $H_3BO_3$ | are mixed and comminuted together for two hours in a 250 ml polyethylene wide-necked bottle using 150 g of aluminum oxide balls with a diameter of 10 mm. Barium fluoride and boric acid serve as fluxes. The mixture is fired for three hours in a covered corundum crucible at 1550° C. in forming gas (nitrogen containing 2.3% by volume hydrogen) and then milled in an automatic mortar mill and screened through a screen with a mesh width of 53 µm. This is followed by a second firing for three hours at 1500° C. under forming gas (nitrogen containing 0.5% by volume hydrogen). Then, milling and screening is carried out as after the first firing. The phosphor obtained corresponds to the composition $(Y_{0.29}Tb_{0.67}Ce_{0.04})_3Al_5O_{12}$. It has a strong yellow body color. An emission spectrum for this phosphor when excited at 430 nm and a reflectance spectrum for the phosphor between 300 and 800 nm are shown in FIGS. 1 and 2.

Figure 3:
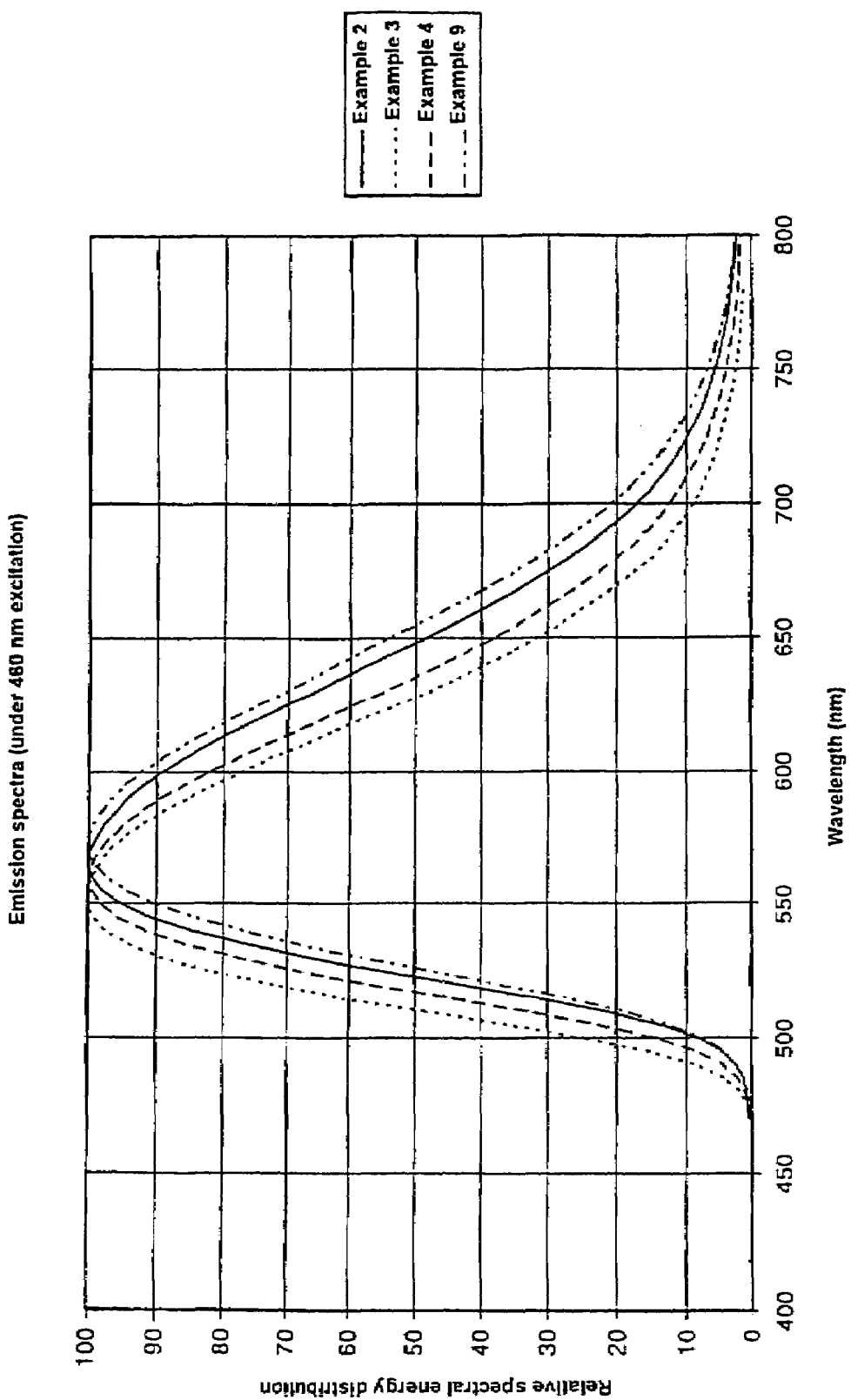
FIG. 3 shows emission spectra of further Tb-garnet phosphors.
Figure 4:
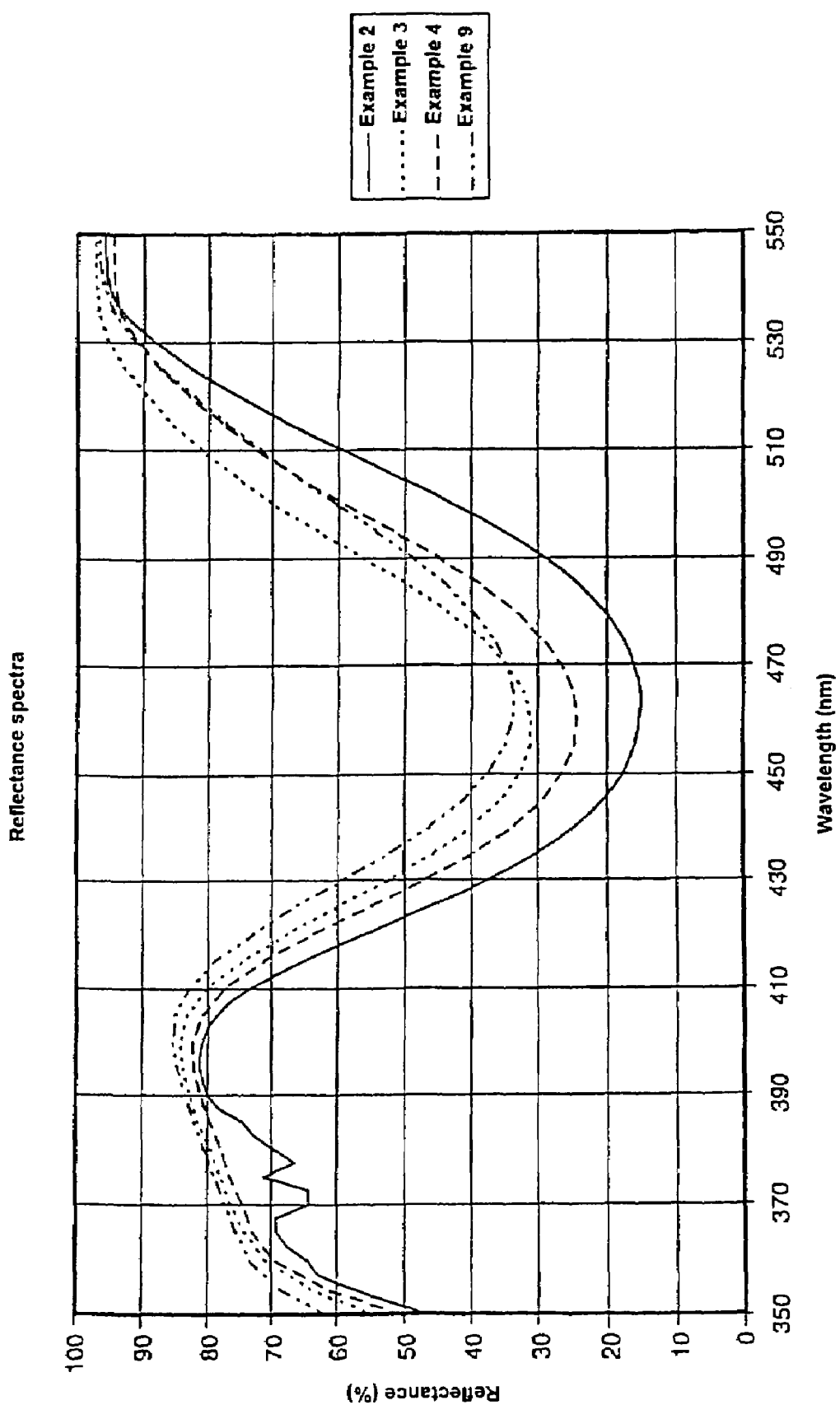
FIG. 4 shows reflectance spectra of the Tb-garnet phosphors from FIG. 3.

Exemplary Embodiment No. 2:

| The components | |
|---|---|
| 43.07 g | Terbium oxide $Tb_4O_7$ |
| 1.65 g | Cerium oxide $CeO_2$ |
| 21.13 g | Aluminum oxide $Al_2O_3$ |
| 0.12 g | Barium fluoride $BaF_2$ |
| 0.062 g | Boric acid $H_3BO_3$ | are intimately mixed and processed as described under Example 1. The phosphor obtained corresponds to the overall composition $(Tb_{0.96}Ce_{0.04})_3Al_5O_{12}$ or, in the representation which illustrates the host lattice, $Tb_3Al_5O_{12}$:Ce. It has a strong yellow body color. The X-ray diffraction diagram shows that there is a cubic garnet phase. The emission spectrum and reflectance spectrum for this phosphor are shown in FIGS. 3 and 4, respectively.

Exemplary Embodiment No. 3:

| The components | |
|---|---|
| 32.18 g | Yttrium oxide $Y_2O_3$ |
| 0.56 g | Terbium oxide $Tb_4O_7$ |
| 2.07 g | Cerium oxide $CeO_2$ |
| 26.41 g | Aluminum oxide $Al_2O_3$ |
| 0.077 g | Boric acid $H_3BO_3$ | are intimately mixed and processed as described under Example No. 1. The phosphor obtained corresponds to the composition $(Y_{0.95}Tb_{0.01}Ce_{0.04})_3Al_5O_{12}$. It has a strong yellow body color. The emission spectrum and reflectance spectrum for this phosphor are shown in FIGS. 3 and 4, respectively.

Exemplary Embodiment No. 4:

| The components | |
|---|---|
| 26.76 g | Yttrium oxide $Y_2O_3$ |
| 9.53 g | Terbium oxide $Tb_4O_7$ |
| 2.07 g | Cerium oxide $CeO_2$ |
| 26.41 g | Aluminum oxide $Al_2O_3$ |
| 0.149 g | Barium fluoride $BaF_2$ |
| 0.077 g | Boric acid $H_3BO_3$ | are intimately mixed and processed as described under Example No. 1. The phosphor obtained corresponds to the composition $(Y_{0.79}Tb_{0.17}Ce_{0.04})_3Al_5O_{12}$. It has a strong yellow body color. The emission spectrum and reflectance spectrum for this phosphor are shown in FIGS. 3 and 4, respectively.

Exemplary Embodiment No. 5

| The components | |
|---|---|
| 30.82 g | Yttrium oxide $Y_2O_3$ |
| 0.56 g | Terbium oxide $Tb_4O_7$ |
| 4.13 g | Cerium oxide $CeO_2$ |
| 26.41 g | Aluminum oxide $Al_2O_3$ |
| 0.149 g | Barium fluoride $BaF_2$ |
| 0.077 g | Boric acid $H_3BO_3$ | are intimately mixed and processed as described under Example No. 1. The phosphor obtained corresponds to the composition $(Y_{0.91}Tb_{0.01}Ce_{0.08})_3Al_5O_{12}$. It has a strong yellow body color.

Exemplary Embodiment No. 6:

| The components | |
|---|---|
| 43.07 g | Terbium oxide $Tb_4O_7$ |
| 1.65 g | Cerium oxide $CeO_2$ |

-continued

Figure 5:
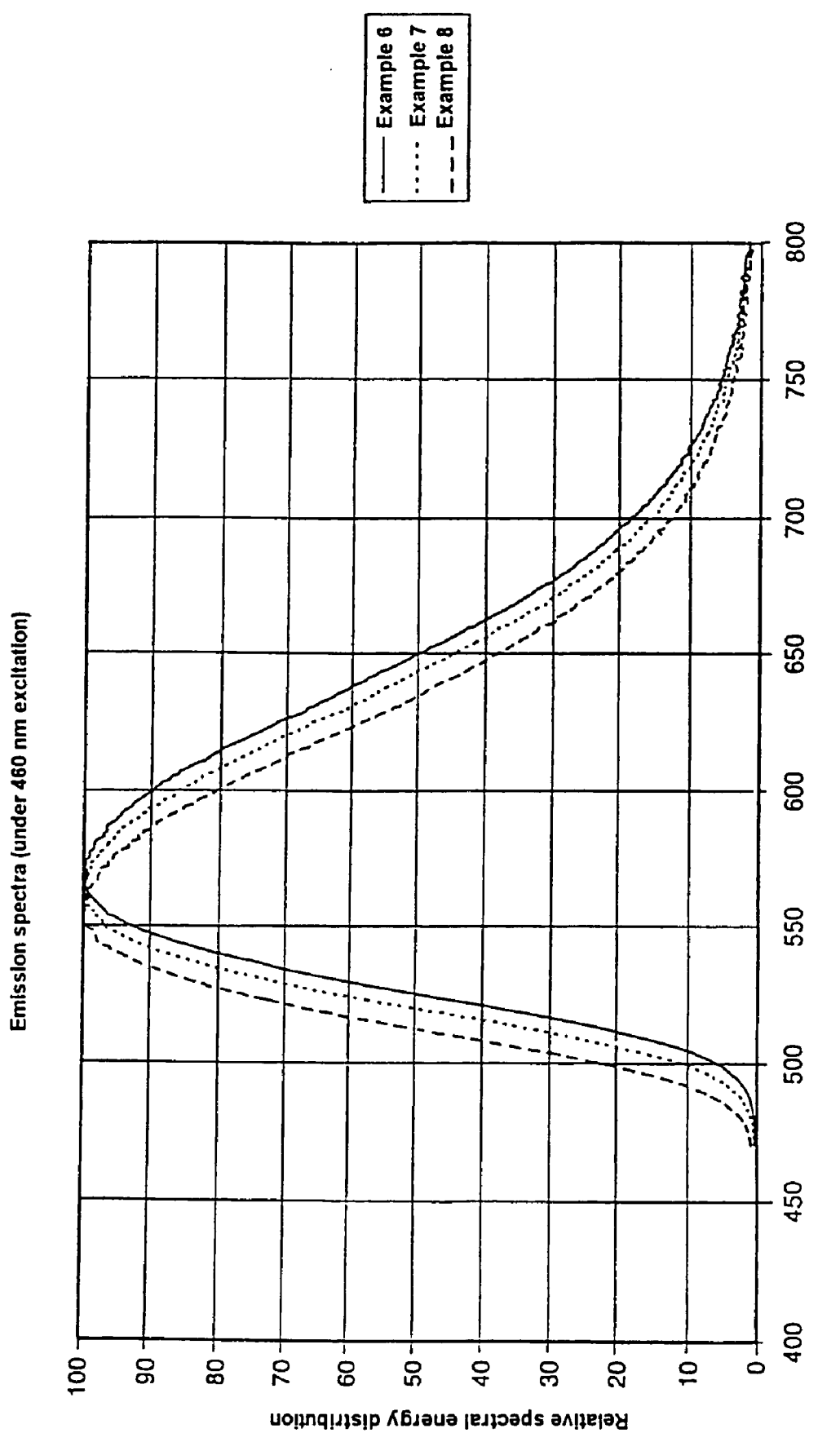
FIG. 5 shows emission spectra for further Tb-garnet phosphors.
Figure 6:
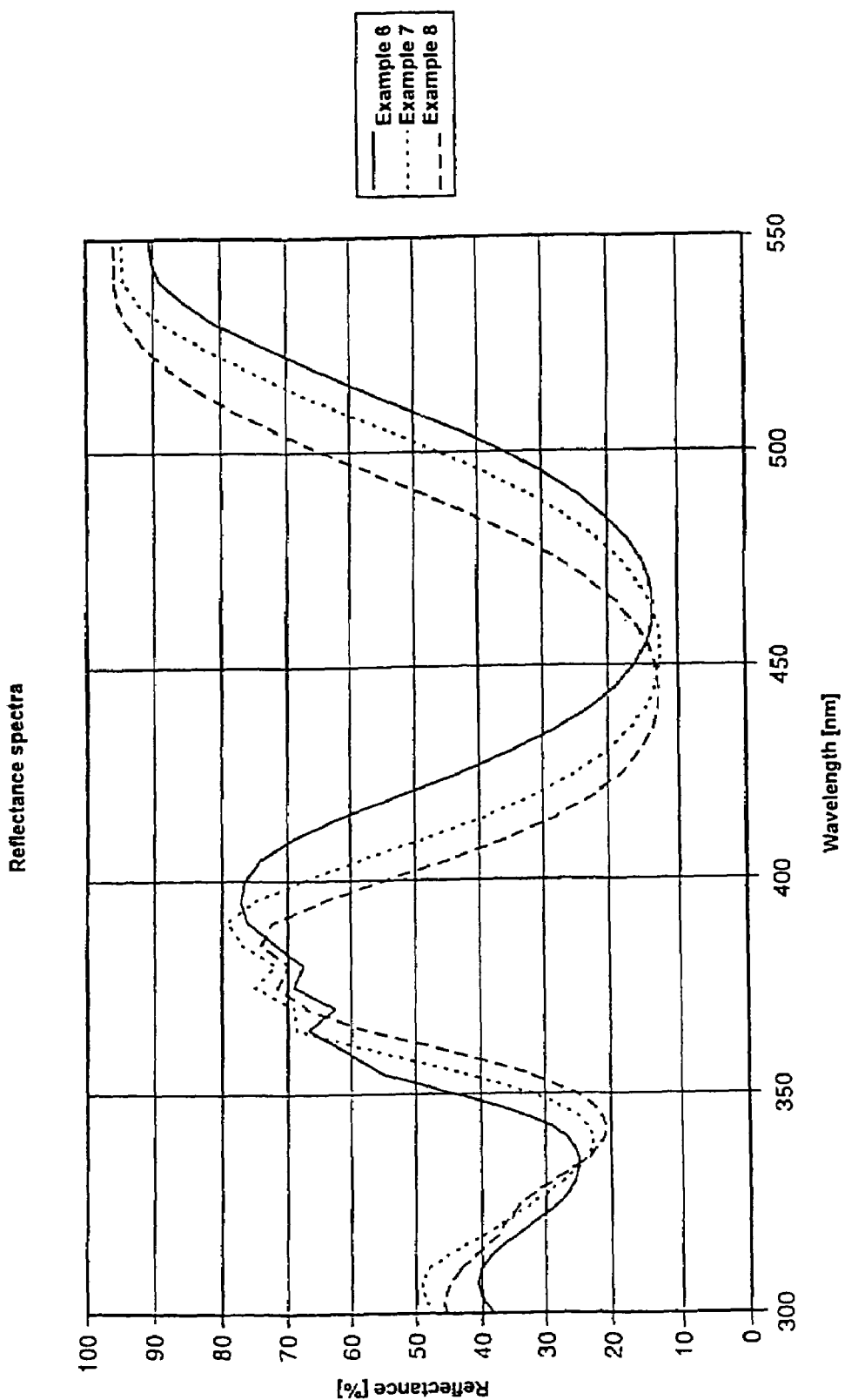
FIG. 6 shows reflectance spectra for the Tb-garnet phosphors from FIG. 5.

| The components | |
|---|---|
| 21.13 g | Aluminum oxide $Al_2O_3$ |
| 0.062 g | Boric acid $H_3BO_3$ | are intimately mixed and processed as described under Example 1, except that the temperature during the two firings is lower by 50° C. in each case. The phosphor obtained corresponds to the composition $(Tb_{0.96}Ce_{0.04})_3Al_5O_{12}$. It has a strong yellow body color. The emission spectrum and reflectance spectrum for this phosphor are shown in FIGS. 5 and 6, respectively.

Exemplary Embodiment No. 7:

| The components | |
|---|---|
| 43.07 g | Terbium oxide $Tb_4O_7$ |
| 1.65 g | Cerium oxide $CeO_2$ |
| 17.05 g | Aluminum oxide $Al_2O_3$ |
| 7.50 g | Gallium oxide $Ga_2O_3$ |
| 0.062 g | Boric acid $H_3BO_3$ | are intimately mixed and processed as described under Example 1, except that the temperature for the two firings is lower by 50° C. in each case. The phosphor obtained corresponds to the composition $(Tb_{0.96}Ce_{0.04})Al_4GaO_{12}$. It has a strong yellow body color. The emission spectrum and reflectance spectrum for this phosphor are shown in FIGS. 5 and 6, respectively.

Exemplary Embodiment No. 8:

| The components | |
|---|---|
| 43.07 g | Terbium oxide $Tb_4O_7$ |
| 1.65 g | Cerium oxide $CeO_2$ |
| 12.97 g | Aluminum oxide $Al_2O_3$ |
| 15.00 g | Gallium oxide $Ga_2O_3$ |
| 0.062 g | Boric acid $H_3BO_3$ | are intimately mixed and processed as described under Example 1, except that the temperature for the two firings is lower by 50° C. in each case. The phosphor obtained corresponds to the composition $(Tb_{0.96}Ce_{0.04})_3Al_3Ga_2O_2$. It has a yellow body color. The emission spectrum and reflectance spectrum of this phosphor are shown in FIGS. 5 and 6, respectively.

Exemplary Embodiment No. 9

| The components | |
|---|---|
| 4.88 kg | Yttrium oxide $Y_2O_3$ |
| 7.05 kg | Gadolinium oxide $Gd_2O_3$ |
| 161.6 g | Terbium oxide $Tb_4O_7$ |
| 595 g | Cerium oxide $CeO_2$ |
| 7.34 kg | Aluminum oxide $Al_2O_3$ |
| 5.50 g | Boric acid $H_3BO_3$ | are mixed for 24 hours in a 60 l polyethylene vessel. The mixture is introduced into crucibles made from aluminum oxide with a capacity of approx. 1 l and is fired in a pushed-bat kiln for 6 hours at 1550° C. under forming gas. The fired material is milled in an automatic mortar mill and then finely screened. The phosphor obtained has the composition $(Y_{0.50}Gd_{0.45}Tb_{0.01}Ce_{0.04})_3Al_5O_{12}$. It has a strong yellow body color. The emission spectrum and reflectance spectrum for this phosphor are shown in FIGS. 3 and 4, respectively.

Figure 7:
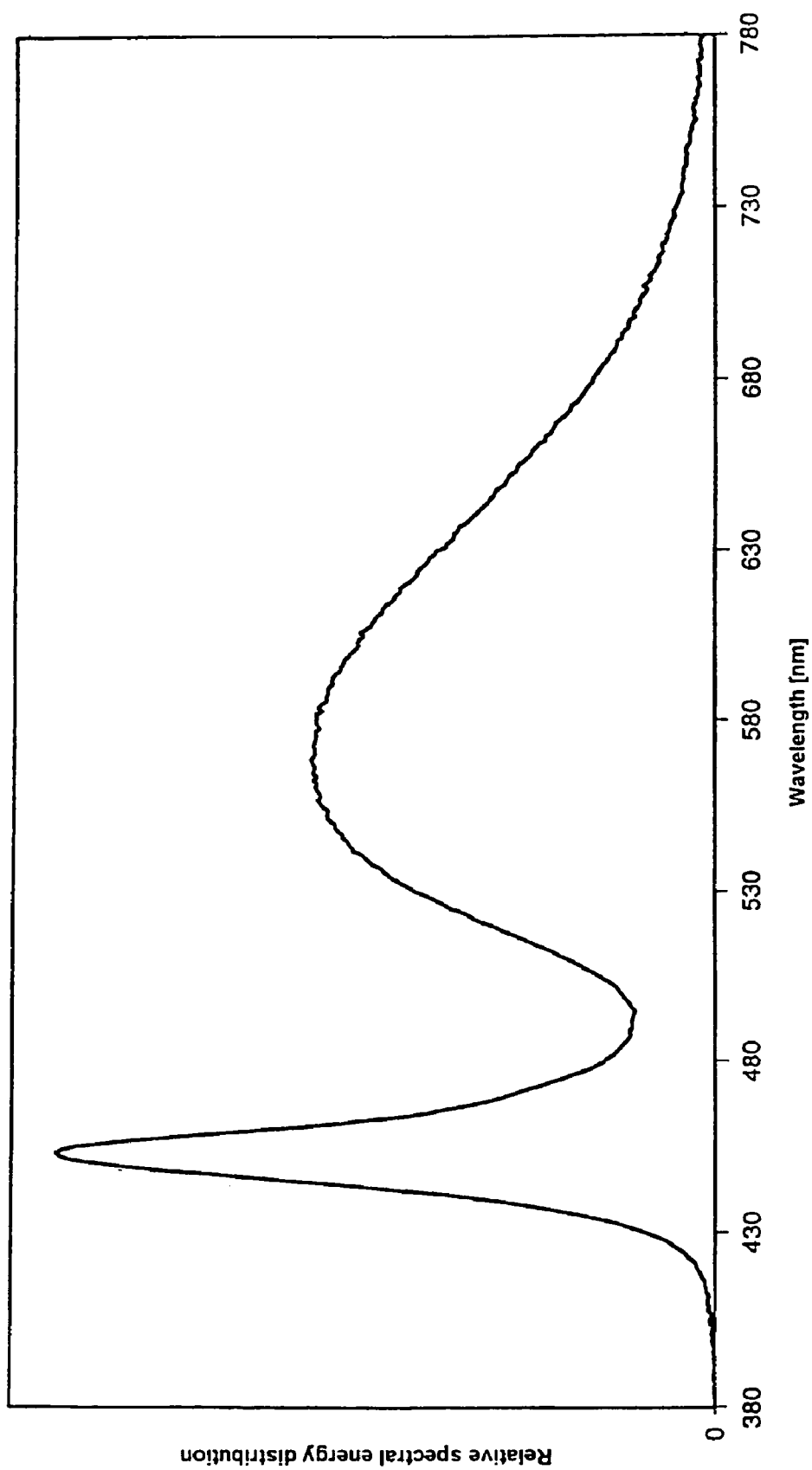
FIG. 7 shows an emission spectrum for a white LED with Tb-garnet phosphor.

Exemplary Embodiment 10 (LED):

When these phosphors are used in a white LED together with GaInN, a structure similar to that described in WO 97/50132 is employed. By way of example, identical fractions of phosphor in accordance with Example 1 and of phosphor in accordance with Example 4 are dispersed in epoxy resin and a LED with an emission peak of approximately 450 nm (blue) is encapsulated by this resin mixture. The emission spectrum of a white LED obtained in this way is shown in FIG. 7. In this case, the mixture of the blue LED radiation with the yellow phosphor emission results in a color locus of x=0.359/y=0.350, corresponding to white light of color temperature 4500 K.

The phosphors described above generally have a yellow body color. They emit in the yellow spectral region. When Ga is added or used on its own instead of Al, the emission shifts more toward green, so that it is also possible in particular to achieve higher color temperatures. In particular, Ga-containing (or Ga,Al-containing) Tb-garnets and purely Al-containing Tb-garnets can be used in mixed form in order to be able to adapt to desired color loci.

The invention claimed is:

1. A method of making a white light source, comprising: encapsulating a light-emitting diode in an epoxy resin having a phosphor dispersed therein, the light emitting diode having an emission from 420 to 490 nm, and the phosphor having a garnet structure as represented by $A_3B_5O_{12}$:Ce wherein A is terbium or terbium together with at least one of the elements Y, Gd, La, and/or Lu and B is at least one of the elements Al and Ga, the phosphor converting at least a part of the emission from the light-emitting diode into a longer-wave radiation.

2. The method of claim 1 wherein A is solely or predominately terbium.

3. The method of claim 1 wherein the light-emitting diode has an emission from 430 to 470 nm.

4. The method of claim 2 wherein the light-emitting diode has an emission from 430 to 470 nm.

5. The method of claim 1 wherein B additionally contains In.

6. The method of claim 1 wherein the light-emitting diode is based on Ga(In)N.

7. A method of making a white light source, comprising: encapsulating a light-emitting diode in an epoxy resin having a phosphor dispersed therein, the light emitting diode having an emission from 420 to 490 nm, the phosphor converting at least a portion of the emission from the light-emitting diode into a longer-wave radiation and having a garnet structure represented by
$(Tb_{1-x-y}RE_xCe_y)_3(Al,Ga)_5O_{12}$, where
RE is Y, Gd, La and/or Lu;
$0 \leq x \leq 0.5-y$; and
$0 < y < 0.1$.

8. The method of claim 7 wherein x is in the range $0.25 \leq x \leq 0.5-y$.

9. The method of claim 7 wherein y is in the range $0.02 < y < 0.06$.

10. The method of claim 7 wherein x is in the range $0.25 \leq x < 0.5-y$ and y is in the range $0.02 < y < 0.06$.

11. The method of claim 7 wherein the light source has a color temperature of below 5000 K.

12. The method of claim 7 wherein the light source has a color temperature of 4500 K.

13. The method of claim 1 wherein the phosphor contains from 0.03 to less than 3 moles of terbium per mole of phosphor.

14. The method of claim 7 wherein the light-emitting diode is based on Ga(In)N.

15. A method of making a white light source, comprising: encapsulating a light-emitting diode in an epoxy resin having a phosphor dispersed therein, the light emitting diode having an emission from 420 to 490 nm, the phosphor converting at least a portion of the emission from the light-emitting diode into a longer-wave radiation, the phosphor having a garnet structure represented by $(Tb_x RE_{1-x-y} Ce_y)_3 (Al,Ga)_5 O_{12}$, where RE is Y, Gd, La and/or Lu;
$0.01 \leq x \leq 0.02$; and
$0 < y < 0.1$.

16. The method of claim 15 wherein x is 0.01.

17. The method of claim 15 wherein y is in the range $0.01 \leq y \leq 0.05$.

18. The method of claim 16 wherein y is in the range $0.01 \leq y \leq 0.05$.

19. The method of claim 16 wherein the phosphor has a garnet structure represented by $(Y_{0.50} Gd_{0.45} Tb_{0.01} Ce_{0.04})_3 Al_5 O_{12}$.

20. The method of claim 15 wherein the light-emitting diode is based on Ga(In)N.

21. A process for producing a phosphor having a garnet structure as represented by $A_3 B_5 O_{12}$:Ce, wherein A is terbium or terbium together with at least one of the elements Y, Gd, La, and/or Lu and B is at least one of the elements Al and Ga, the process comprising:

(a) intimately mixing cerium oxide, oxides of A and B, and at least one flux to form a mixture; and (b) firing the mixture in forming gas to form the phosphor.

22. The process of claim 21 wherein the flux is $BaF_2$, $HBO_3$, or both.

23. The process of claim 21 wherein the forming gas is a mixture of nitrogen and hydrogen gases wherein the hydrogen is 2.3% by volume.

24. The process of claim 21 wherein a stoichiometric excess of an oxide of B is used to form the mixture.

25. The process of claim 21 wherein a stoichiometric excess of aluminum oxide is used to form the mixture.

26. The process of claim 21 wherein A is predominantly or solely terbium.

27. The process of claim 21 wherein the phosphor has a garnet structure represented by $(Tb_{1-x-y} RE_x Ce_y)_3 (Al,Ga)_5 O_{12}$, where RE is Y, Gd, La and/or Lu
$0 \leq x \leq 0.5-y$; and
$0 < y < 0.1$.

28. The process of claim 21 wherein the mixture is fired at a temperature from 1450° C. to 1550° C.

29. The process of claim 28 wherein the mixture is fired for 3 hours to 6 hours.

30. A process for producing a phosphor having a garnet structure as represented by $A_3 B_5 O_{12}$:Ce, wherein A is terbium or terbium together with at least one of the elements Y, Gd, La, and/or Lu and B is at least one of the elements Al and Ga, the process comprising:

(a) intimately mixing cerium oxide, oxides of A and B, and at least one flux to form a mixture;

(b) firing the mixture in forming gas;

(c) milling the fired mixture; and (d) firing the mixture in forming gas for a second time to form the phosphor.

31. The process of claim 30 wherein the firings are performed at a temperature from 1450° C. to 1550° C.

32. The process of claim 31 wherein the firings are each for three hours.

33. The process of claim 30 wherein a stoichiometric excess of an oxide of B is used.

34. The process of claim 30 wherein a stoichiometric excess of aluminum oxide is used.

35. The process of claim 30 wherein A is predominantly or solely terbium.

36. The process of claim 30 wherein the flux is $BaF_2$, $HBO_3$, or both.

37. A process for producing a phosphor having a garnet structure as represented by $(Tb_{1-x-y} RE_x Ce_y)_3 (Al,Ga)_5 O_{12}$, where RE is Y, Gd, La and/or Lu
$0 \leq x \leq 0.5-y$; and
$0 < y < 0.1$;

the process comprising:

(a) intimately mixing cerium oxide and terbium oxide with at least one flux and at least one oxide of RE, Al, and/or Ga, to form a mixture;

(b) firing the mixture in forming gas;

(c) milling the fired mixture; and (d) firing the mixture in forming gas for a second time to form the phosphor.

38. The process of claim 37 wherein a stoichiometric excess of aluminum oxide is used.

39. The process of claim 37 wherein the firings are performed at a temperature from 1450° C. to 1550° C.

40. The process of claim 39 wherein a stoichiometric excess of aluminum oxide is used.

41. The process of claim 40 wherein the firings are each for three hours.

* * * * *